United States Patent
Van Dijk et al.

(10) Patent No.: US 7,188,295 B2
(45) Date of Patent: Mar. 6, 2007

(54) METHOD AND APPARATUS FOR EMBEDDING AN ADDITIONAL LAYER OF ERROR CORRECTION INTO AN ERROR CORRECTING CODE

(75) Inventors: Marten Erik Van Dijk, Cambridge, MA (US); Kouhei Yamamoto, Shinagawa-ku (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 42 days.

(21) Appl. No.: 10/509,478

(22) PCT Filed: Mar. 14, 2003

(86) PCT No.: PCT/IB03/01003

§ 371 (c)(1),
(2), (4) Date: Sep. 29, 2004

(87) PCT Pub. No.: WO03/085839

PCT Pub. Date: Oct. 16, 2003

(65) Prior Publication Data

US 2005/0154959 A1      Jul. 14, 2005

(30) Foreign Application Priority Data

Apr. 5, 2002  (EP) .................................. 02076356

(51) Int. Cl.
   *H03M 13/00*   (2006.01)

(52) U.S. Cl. ...................................... 714/755; 714/758

(58) Field of Classification Search ................ 714/755, 714/792, 800, 758
See application file for complete search history.

(56) References Cited

U.S. PATENT DOCUMENTS

| | | | | |
|---|---|---|---|---|
| 5,247,523 A * | 9/1993 | Arai et al. | ................... | 714/755 |
| 5,740,186 A * | 4/1998 | Widmer | ...................... | 714/753 |
| 5,757,825 A * | 5/1998 | Kimura et al. | .............. | 714/758 |
| 5,784,387 A * | 7/1998 | Widmer | ...................... | 714/752 |
| 6,581,178 B1 * | 6/2003 | Kondo | ......................... | 714/758 |
| 6,604,217 B1 * | 8/2003 | Kahlman | ..................... | 714/752 |
| 6,621,982 B1 * | 9/2003 | Kimura et al. | .............. | 386/116 |
| 2001/0050622 A1 * | 12/2001 | Hewitt et al. | ................. | 341/50 |
| 2002/0147954 A1 * | 10/2002 | Shea | .......................... | 714/755 |

FOREIGN PATENT DOCUMENTS

WO    WO 0007300    2/2000

* cited by examiner

*Primary Examiner*—Albert Decady
*Assistant Examiner*—Mujtaba Chaudry
(74) *Attorney, Agent, or Firm*—Michael E. Belk (57) ABSTRACT

A method of embedding an additional layer of error correction into an error correcting code, where information is encoded into code words that are arranged in columns of a code block. The method includes reducing the length of each row of the code block by adding row symbols together according to a predetermined adding rule resulting in a reduced code block; encoding the shortened rows of the reduced code block using a horizontal error correcting code to obtain horizontal parities; and embedding the horizontal parities as additional layer in the error correcting code.

16 Claims, 9 Drawing Sheets

FIG. 1

(Prior Art)

METHOD AND APPARATUS FOR EMBEDDING AN ADDITIONAL LAYER OF ERROR CORRECTION INTO AN ERROR CORRECTING CODE

The invention relates to a method of embedding an additional layer of error correction into an error correcting code, wherein information is encoded into code words of said code and wherein a number of code words are arranged in the columns of a code block. The invention relates further to a method of decoding such an error correcting code, to corresponding apparatuses, to a storage medium storing code words of such a code, to a signal comprising such code words and to a computer program for implementing said methods.

A method for encoding multiword information by word-wise interleaving is disclosed in WO 00/07300. Therein, a so called picket code is described consisting of two types of code words, LDC (Long Distance Code) code words and BIS (Burst Indicator Subcode) code words, which is intended to be used for DVR (Digital Video Recording) for storing data, particularly video data, on an optical record carrier. The BIS code words provide large error correcting capabilities. Even under worst case circumstances it is extremely unlikely that they can not be decoded correctly. After the decoding of the BIS columns bursts of errors can be recognized. After applying an erasure strategy also the LDC code words, which have less error correcting capabilities, can be decoded correctly.

Compared to existing error correcting codes, e.g. the product code in DVD, the picket code improves the capability of correcting (multiple) burst errors. However, the picket code is less capable of correcting random errors. It is therefore an object of the present invention to provide measures for improving the error correcting capabilities, particularly for correcting random errors which can be easily implemented without losing compatibility with the current error correcting code scheme. Said measures shall be applicable to any error correcting code, particularly in the picket code used for DVR and the product code used for DVD.

A method is provided comprising the steps of:
reducing the length of each row of said code block by adding row symbols together according to a predetermined adding rule resulting in a reduced code block,
encoding the shortened rows of said reduced code block using a horizontal error correcting code to obtain horizontal parities,
embedding said horizontal parities as additional layer in said error correcting code.

The present invention is based on the general idea to generate horizontal parities over a code block of code words which are arranged in the columns of said code block. To reduce the field size of said code block, e.g. to reduce the length of each row of said code block row symbols within each row of said code block are added according to a predetermined adding rule. The generated horizontal parities can then be embedded in said code as an additional layer for error correction. This additional layer can then be used during decoding for correcting erasures, burst errors and decoding failures. The reduction in length of the rows of the code block give the possibility to use an error correcting code over smaller fields thereby reducing the total amount of redundancy. Since the obtained horizontal parities are extra protected a high level of error correcting capabilities can be achieved according to the invention for correcting decoding failures and miscorrections.

The invention also relates to a method of decoding an error correcting code into which an additional layer of error correction is embedded according to the method of encoding as described above, said method comprising the steps of:
extracting said horizontal parities from said error correcting code,
reducing the length of each row of said code block by adding row symbols together identical to the method according to said predetermined adding rule used during the method of encoding according to claim 1 resulting in a reduced code block,
decoding the shortened rows of said reduced code block using said horizontal parities.

Still further, the present invention relates to apparatuses and a storage medium storing data in form of code words of an error correcting code into which an additional layer of error correction is embedded, in particular to an optical record carrier such as a CD, DVD or DVR disc, to a signal comprising data in form of code words and to a computer program comprising program code means for causing a computer to implement the steps of the method when said program is run on a computer.

Advantageously, the present invention is applied in a method using picket codes as particularly used in DVR where said code block is a LDC block comprising LDC code words, in particular [248, 216, 33] Reed Solomon code words over GF ($2^8$), arranged in the columns of said LDC block and where BIS code words are used in addition, in particular [62, 30, 33] Reed Solomon code words over GF ($2^8$). Preferably the obtained horizontal parities are encoded by an additional error correcting code, i.e. when using a picket code, said horizontal parities are preferably encoded and written in the BIS code words.

When applying the invention to a picket code comprising LDC and BIS code words the LDC code words are preferably first reduced in length before the obtained first intermediate block is enlarged in horizontal direction by adding a predetermined number of symbols having predetermined values giving a second intermediate block. Said second intermediate block will then be used as code block to which the predetermined adding rule is applied for reducing its length as described above. For the sake of simplicity, the first intermediate block is enlarged by adding a predetermined number of symbols having symbol value zero to each row in order to slightly reduce the number of required computations.

A predetermined adding rule is used for adding row symbols together to reduce the length of each row of the code block. The defined adding rule corresponds to a rotation of each row of the second horizontal part of the code block by a different number of symbols before adding a symbol of the first part and the symbol of the second part within the same row and from the same column within the first or second part. This leads to an improved error correction capability of the finally obtained horizontal parities.

The present invention can also advantageously be applied to a product code where the code block comprises two blocks of the product code, in particular of a DVD product code. In a preferred embodiment two DVD code blocks comprising DVD product code words such as [182, 172, 11] code words over GF ($2^6$) are combined to form the code block. In such an application the obtained horizontal parities are preferably encoded by an additional parity code, e.g. comprising only the [192, 182, 11] Reed Solomon code words which contain data over GF ($2^8$), and the obtained parities are stored together with the DVD product code words.

The present invention will now explained more in detail with reference to the drawings in which.

Figure 1:
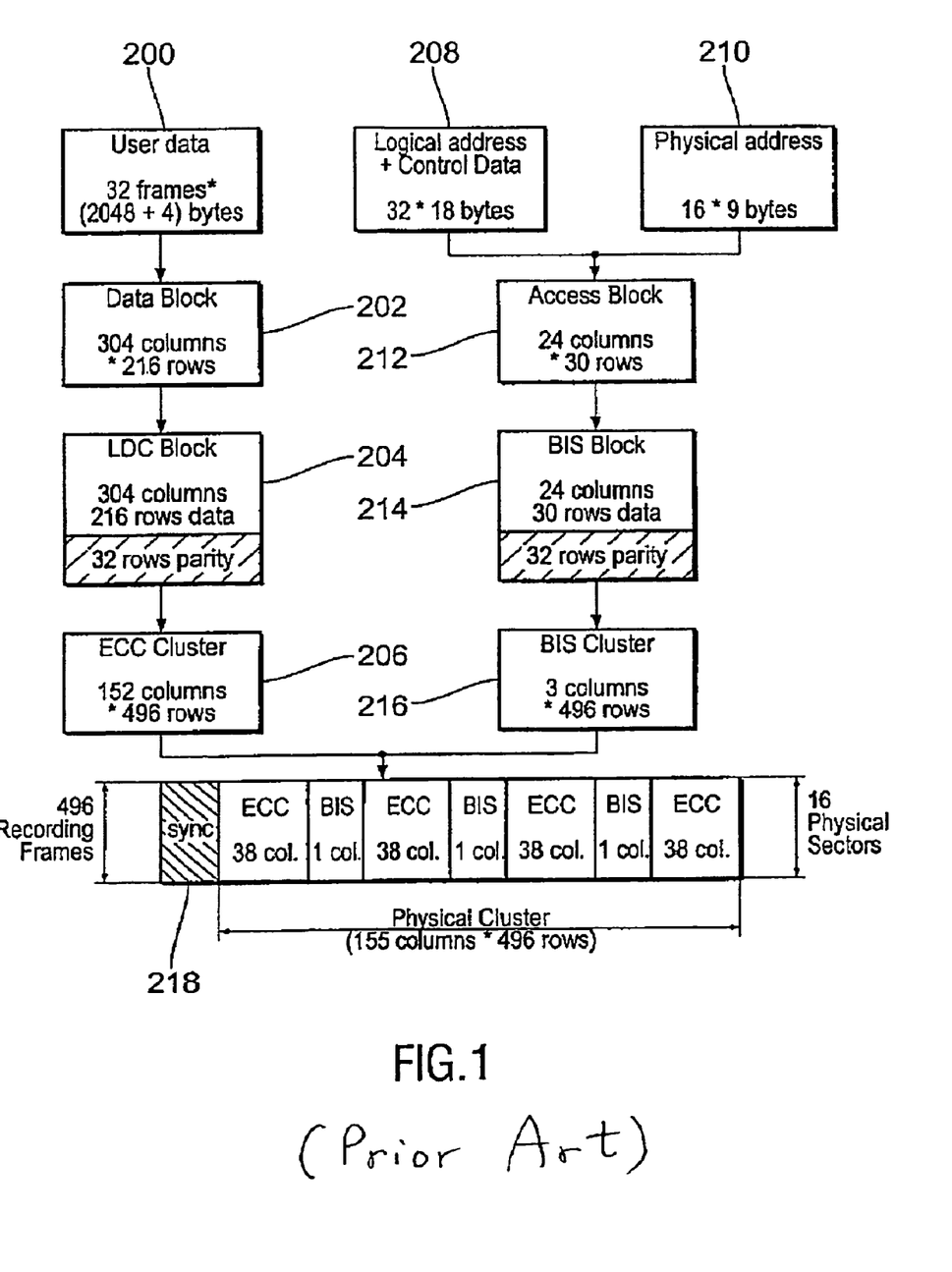
FIG. 1 shows a schematic representation of the encoding process of a picket code.

FIG. 1 shows a schematic representation of a method of encoding as it is described in WO 00/07300. The user data as received from a source that may be a host or an application are first divided into data frames that each consists of 2048+4 bytes; as shown in block 200 of FIG. 1, 32 of these frames are taken into account for the next encoding step. In block 202, a data block is formed and arranged into 304 columns of 216 rows each. In block 204 a Long Distance Code (LDC) block is formed through adding 32 rows parity. In block 206 an ECC cluster is arranged according to 152 columns and 496 rows. This is arranged to fill the four sections labelled ECC in the physical cluster block 218, that is the comprehensive code format NTT.

The address and control data added by a recording system are converted also in successive steps. First the logical address and control data is arranged in 32×18 bytes in block 208. The logical addresses are those that pertain to use of functionalities, and may indicate aspects that relayed to a duration of the rendering of a user program. Also the physical addresses are arranged into 16×9 bytes in block 210. The physical addresses relayed to physical distances on a record carrier, such as an optical disc. Due to the repeated renumbering and interleaving, the relation between physical and logical addresses has been broken. Items that follow each other closely in a program, may be spaced from each other by an appreciable physical distance, and vice versa. Also, the mapping is not uniformly progressing. In block 212, the addresses are combined in an access block of 24 columns by 30 rows. In block 214, there are 32 rows of parity added. In block 216, these are arranged into a Burst Indicator Subcode (BIS) cluster of three columns and 496 rows. These fill the three BIS columns in block 218. Also a column of sync bit groups is added, so that a physical cluster of 155 columns by 496 rows is formed. Together these form 16 physical sectors that are grouped into 496 recording frames as shown.

The described error correcting code comprising LDC code words and BIS code words is generally called picket code and is used in DVR technology. Regarding more details of said code, particularly an encoding and decoding device for said code, the code format, the method of interleaving and mapping and the frame format, reference is made to WO 00/07300 which is herein incorporated by reference.

Figure 2:
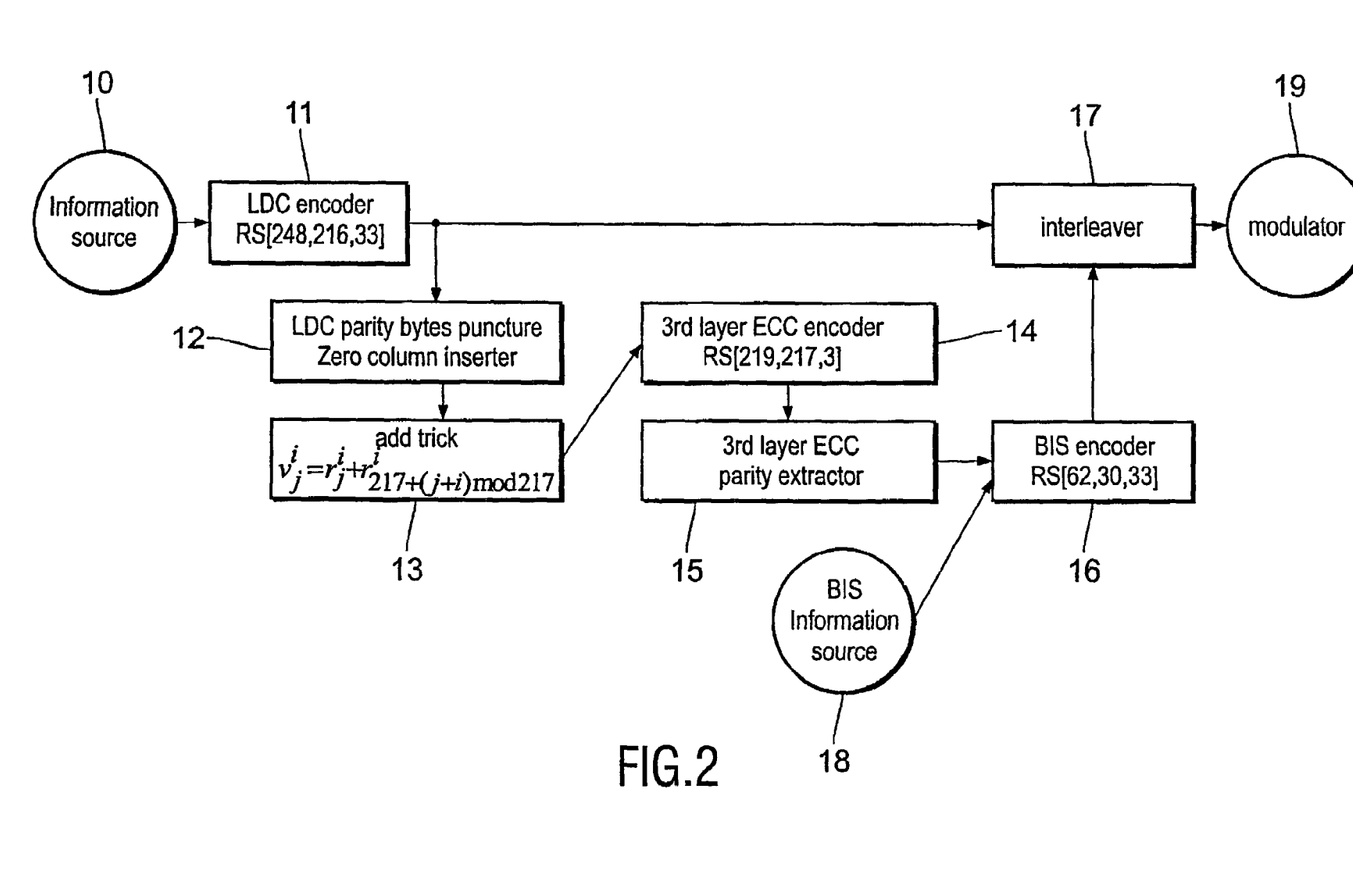
FIG. 2 shows a block diagram of an encoding apparatus according to the present invention.
Figure 3:
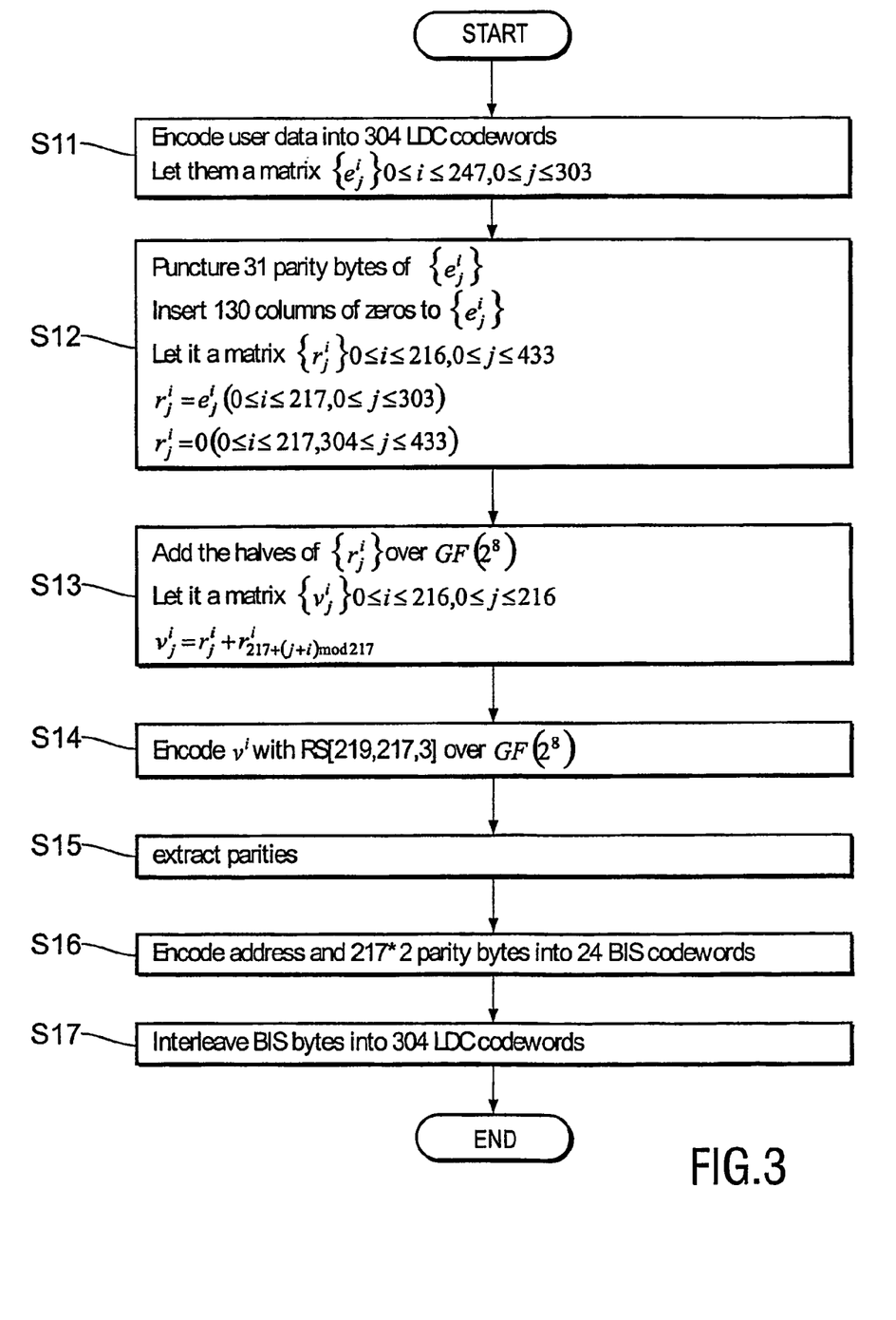
FIG. 3 shows a flow chart of a method of encoding according to the present invention.
Figure 4:
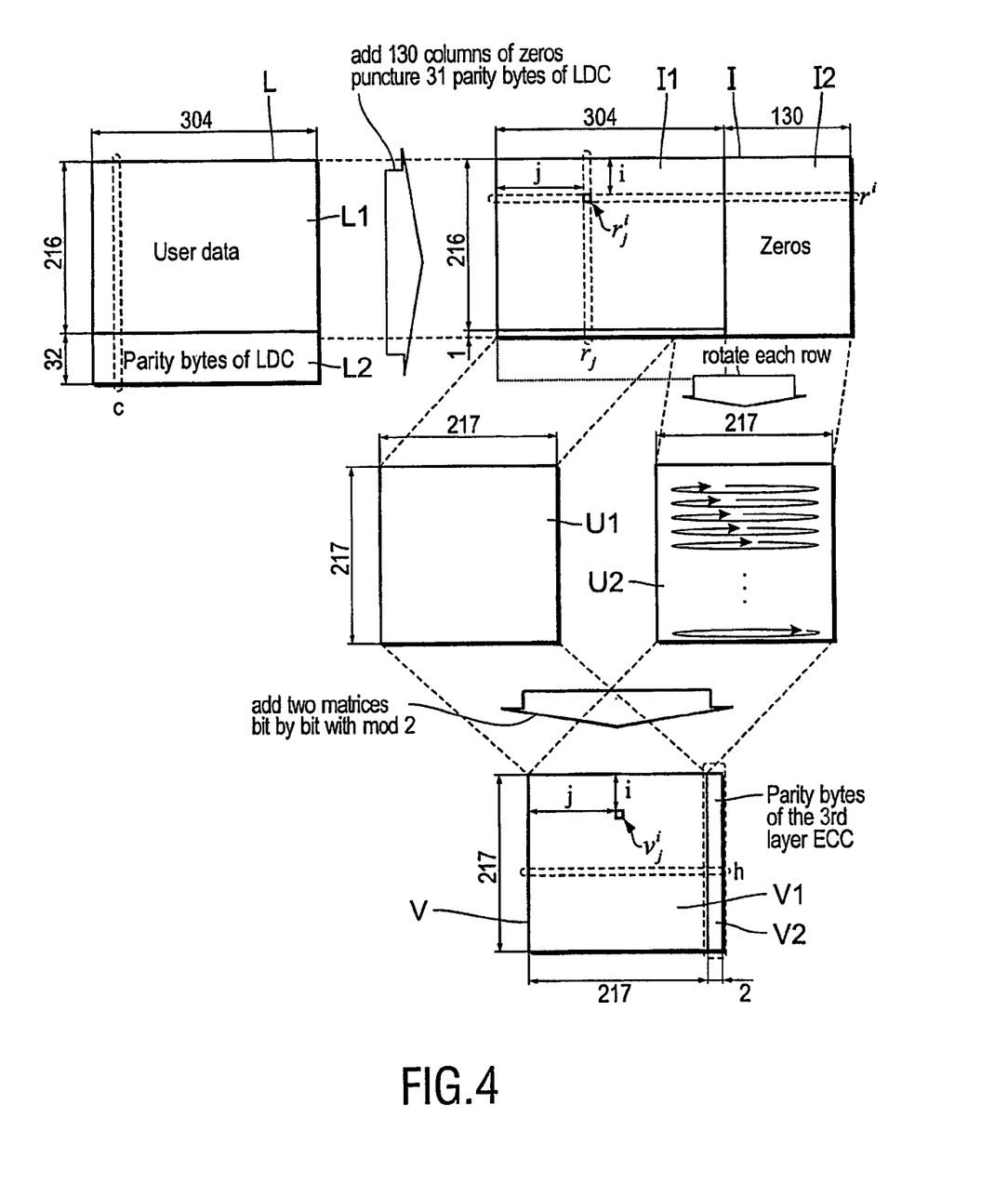
FIG. 4 illustrates the encoding steps of said encoding method.

A block diagram of an apparatus for encoding according to the present invention, particularly for embedding a third layer of error correction into the picket code shown in FIG. 1 comprising the LDC and the BIS layer as two layers, is illustrated in FIG. 2. A corresponding flow chart illustrating the steps of the corresponding method of encoding is shown in FIG. 3. FIG. 4 illustrates the effect of said steps on the code. Using these figures the embedding of an additional layer of error correction into the picket code shall be explained.

In a first step S11 user data coming from an information source 10, e.g. coming from a transmission channel, an application or a storage medium, are encoded into 304 LDC code words which are [248, 216, 33] Reed Solomon (S) code words over a Galois field GF ($2^8$). This encoding is performed by an LDC encoder 11 resulting in an LDC block L comprising a user data sub-block L1 and a parity data sub-block L2. The LDC code words C, each comprising 216 user data symbols and 32 parity symbols, are arranged in the columns of said LDC block L.

In the next step S12 for each LDC code word c 216 code word symbols, for example the 216 user data symbols of the user data sub-block L1, are encoded into a [217, 216, 2] code word by unit 12. To achieve this, each of the LDC code words c can be punctured in 31 positions leaving 304 [217, 216, 2] RS code words over GF ($2^8$). Alternatively, for each of the LDC code words c 216 code word symbols can be taken and an overall parity symbol can be computed for these 216 symbols. Thus, a first intermediate code block I1 comprising 304 [217, 216, 2] code words $r_j$, where $0 \leq j \leq 216$, is formed. This first intermediate code block I1 has 217 rows $r^i = (r_0^i, \ldots r_{303}^i)$, where $0 \leq i \leq 216$. These rows are extended by adding 2×217−304=130 zeros, i.e. by adding a block I2 of zeros, resulting in a second intermediate code block I comprising 434 columns and 217 rows of code symbols $r_j^i = 0$ for $0 \leq i \leq 216$ and $0 \leq j \leq 433$. This second intermediate code block I can be split up into two halves U1 and U2 each comprising 217 rows and 217 columns.

Next, these two code blocks U1, U2 are transformed into a reduced code block V1 by adding a row symbol of the second code block U2 to a code symbol of the first code block U1 according to a predetermined adding rule for each row symbol of the first code block U1. As a particular example each row $r^i$ of the second intermediate code block I2 is transformed in unit 13 into a code vector $v^i$ of shorter length of said reduced code block V1 as follows:

$$v_j^i = r_j^i + r_{217+(j+i \bmod 217)}^i$$

for $0 \leq i, j \leq 216$ in block 13 (step 13).

The new code vectors $v^i$ are systematically encoded in horizontal direction by a third layer ECC encoder 14 (step S14) by means of a [219, 217, 3] RS code over GF ($2^8$) to obtain horizontal parities V2. A code block V comprising 217 horizontal [219, 217, 3] RS code words h of 219 symbols is thus obtained The encoding of the 217 vectors $v^i$ thus produces 217×2=434 parity symbols which are extracted by a third layer ECC parity extractor 15 (step S15). These horizontal parities are encoded and written in the BIS code words together with BIS information from a BIS information source 18 by a BIS encoder 16 using a [62, 30, 33] RS code (S16). This is possible since in the current format of the picket code 576 bytes in the BIS code words are undefined of which 434 bytes are used for embedding said horizontal parities. The rest of the current format stays the same; the third layer only consists of these 434 extra horizontal parity bytes. In an interleaver 17 (step S17) the BIS code words are finally interleaved in the LDC code words as described in WO 00/07300 before the interleaved datastream is outputted to a modulator 19 for further processing. Since the third layer proposed by the present invention is compatible with the known error correction encoding and decoding scheme a DVR-player does not necessarily need to implement the decoding of said third layer.

It should be noted that the described adding rule for adding code elements of the first and second code block U1, U2 and the extension of the first intermediate code block I1 by adding a number of symbols having zero value are just examples. A different adding rule can be used as well as long as the rule is predetermined and known to a decoder for decoding the finally obtained code. The same holds for the extension of the first intermediate code block. An extension using symbols having value one or an extension using a predetermined sequence of symbols can be used as well. For example, the use of 2×253−304=202 zeros for extending each row of the first intermediate code block I1 is a possibility as well leading to 217 [255, 253, 3] RS code words.

Figure 5:
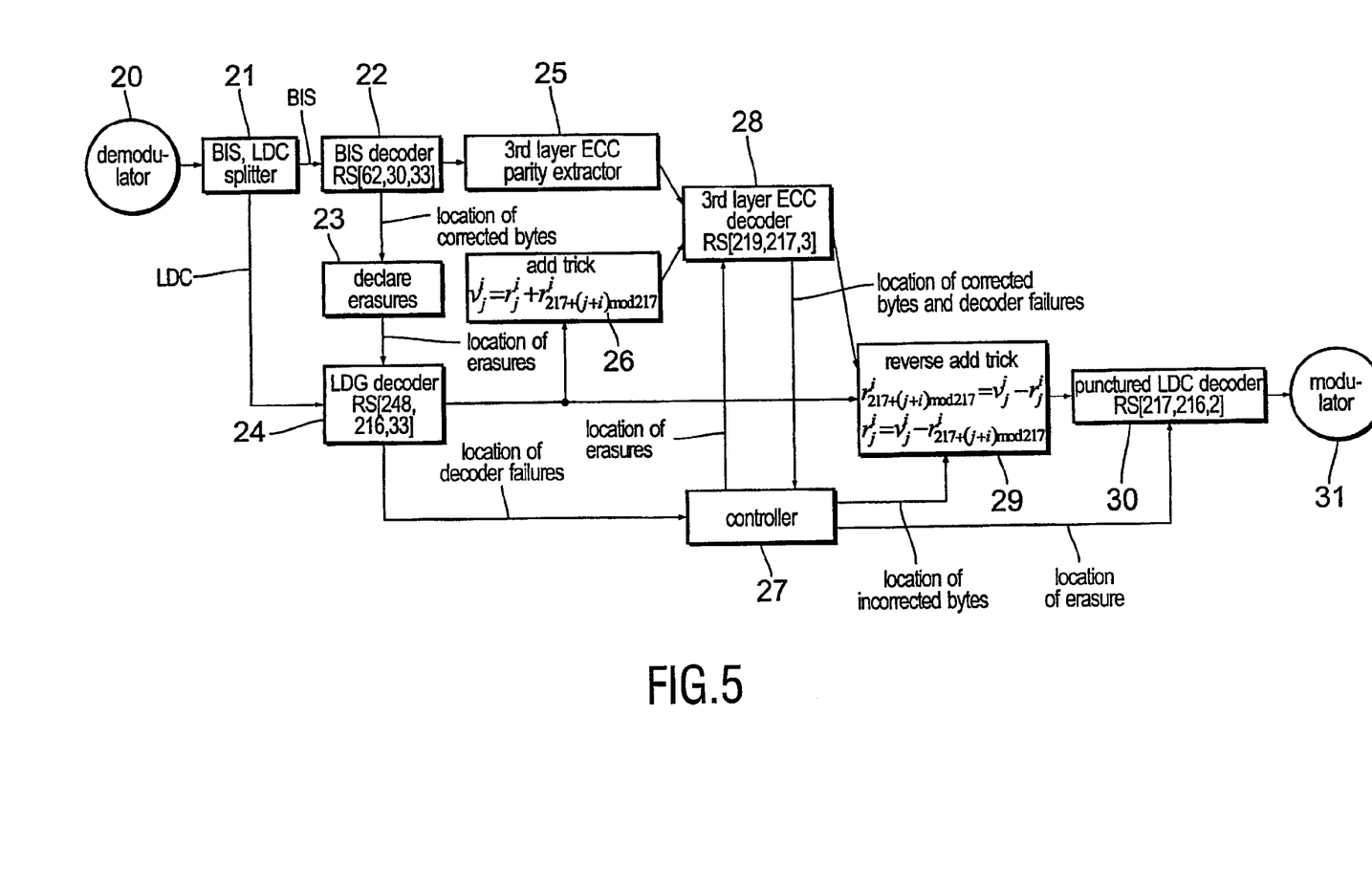
FIG. 5 shows a block diagram of a decoding apparatus according to the present invention.
Figure 6A:
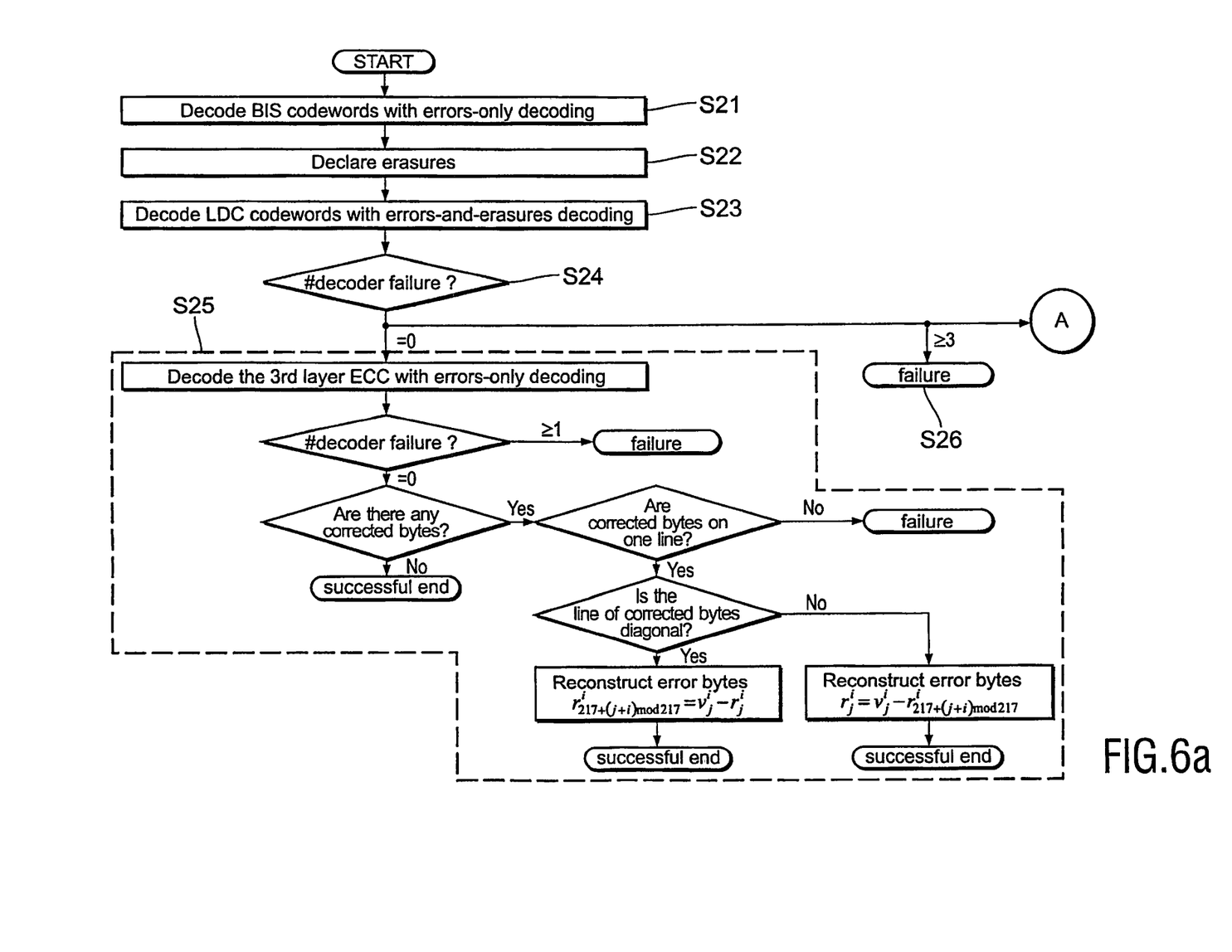
FIG. 6 shows a flow chart of a method of decoding according to the present invention.
Figure 6B:
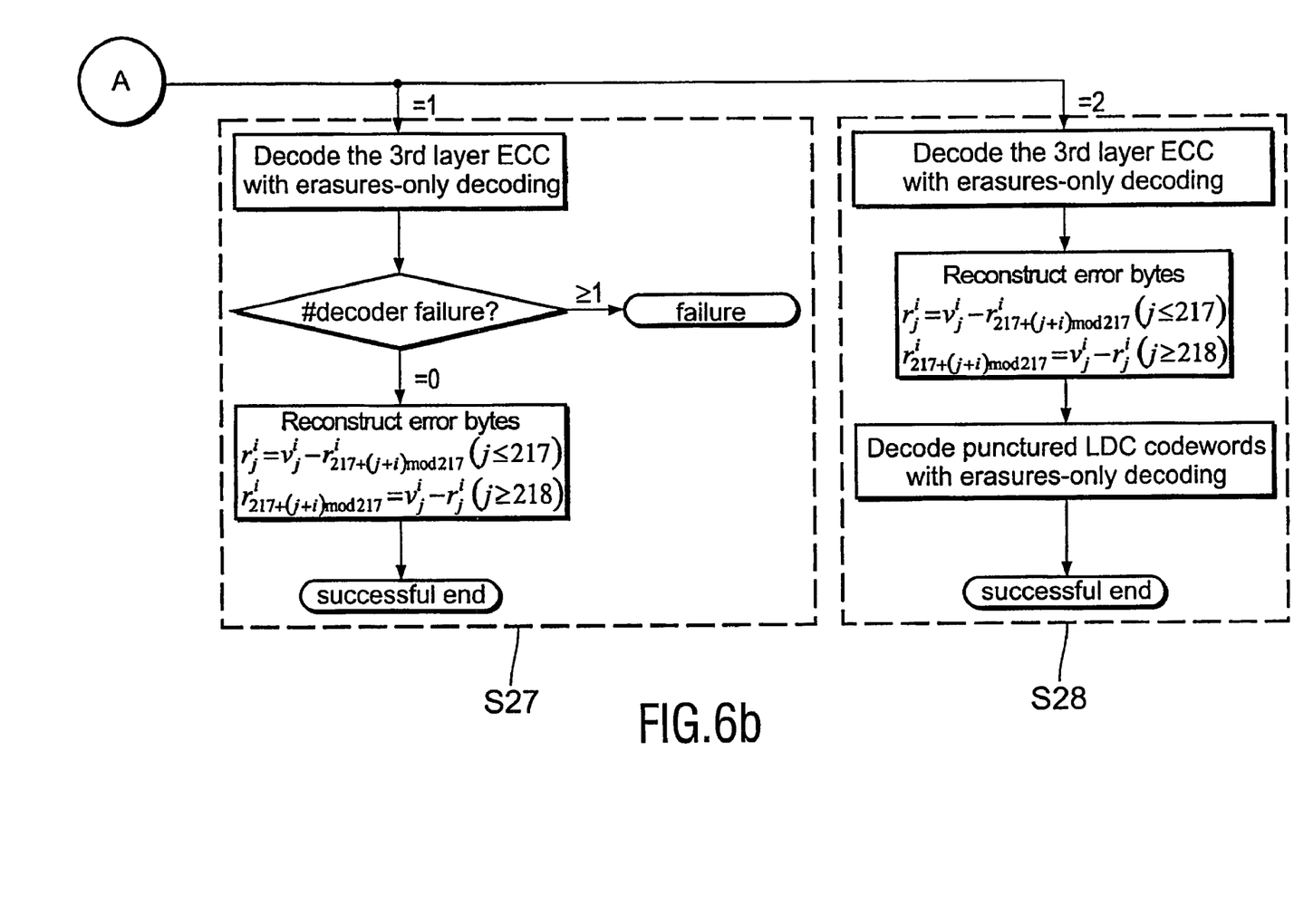

Decoding of the extended picket code comprising a third layer of error correction as described above will now be explained more in detail with reference to FIGS. 5 and 6 which show a block diagram of a decoding apparatus according to the present invention (FIG. 5) and a flow chart illustrating the method of decoding according to the present invention (FIG. 6). The picket code is decoded by decoding the BIS code words, applying an erasure strategy, and decoding the LDC code words. It will be explained in the following how the third layer embedded in the picket code according to the present invention provides protection against one or two decoding failures and against one miscorrrection of LDC code words.

At first, from the data stream received from a demodulator 20 comprising the BIS code words and the LDC code words, the BIS code words are extracted by a BIS-LDC splitter 21 and the BIS code words are decoded first by a BIS decoder 22 (step S21). Therein, errors-only decoding is applied. Since the BIS code words are protected with a very high error correction capability it shall be assumed that all BIS code words are decoded correctly. Thus, the two parities of each of the 217 [219, 217, 3] RS code words of the code block V shown in FIG. 4 are known. Further, this provides knowledge about burst errors because these affect neighbouring BIS bytes, and this recognition leads to erasing LDC bytes where burst errors are susptected, i.e. erasures are declared in unit 23 (step S 22). Now, the LDC code words are corrected by a LDC decoder 24 (step S23). However, Hamming distance 33 is maybe not sufficient since 1 redundant byte for the correction of each erasure is required for computing the error value and 2 redundant bytes for each remaining errors for computing the error location plus the error value. It should be noted that without recognition of the burst errors 2 bytes would be required to correct each burst error byte. With the recognition only 1 byte is required to correct a recognized burst error byte.

It shall be assumed that for 2 corrupted LDC code words the decoding failed, i.e. that there are 2 decoding failures. Let a and b be the corresponding column indices. Considering row i, then $v_j^i$ can be computed as described above if $\{j, 217+(j+i \bmod 217)\} \cap \{a, b\} = \emptyset$. Since, given i, the sets $\{j, 217+(j+i \bmod 217)\}$ partition the set of indices $\{0, \ldots, 433\}$ all but 2 coordinates $v_j^i$ can be reconstructed. This leaves at most 2 erasures in the corresponding [219, 217, 3] RS code word. These can be corrected by using the extra parity check information which can be extracted by a third layer ECC parity extractor 25 from the decoded BIS code words.

By using the knowledge $v_j^i$ for all $0 \le i$, $j \le 216$ and by using their definition as described above the code symbols $r_j^i$ can be reconstructed if $\{j, 217+(j+i \bmod 217)\} \ne \{a, b\}$. All sets $\{j, 217+(j+i \bmod 217)\}$ are unequal to one another. Thus, in at most one row $r^j$ there remain two unknown coordinates. Their corresponding columns are [217, 216, 2] code words. By straightforward erasure correction the two remaining unknowns can be reconstructed. If necessary, all LDC code words can be completely reconstructed. This completes the third layer decoding.

In general, a controller 27 controls, depending on the location of erasures and decoder failures the third layer ECC decoder 28 which returns the location of corrected bytes and decoder failures. To enable a decoding of the third layer the reduced code block V1 is reconstructed according to the adding rule which had been used during encoding by unit 26. Further, unit 29 is provided for applying the reverse "adding trick" to reconstruct the rows of the code blocks U1 and U2. Finally, based on the location of errors an LDC decoder 30 is provided for decoding punctured LDC code words of the first intermediate code block I1 with erasures-only decoding. A resulting data stream is finally outputted to a modulator 31 for further processing.

For the decoding many cases shall be distinguished. Primarily, the number of decoder failures is used for distinguishing both cases (step S24). If there is only one decoding failure (S27) the parity check given by the [217, 216, 2] code structure does not need to be used. Actually, one of the two parities in the [219, 217, 3] RS code is an overall parity check. Together with the above described formula for calculating the code vectors v, this means that parities of the form $\Sigma_j r_j^i$ are available for each i. That is, overall parities of the rows $r^i$ are available. So, if one column is erased due to a decoding failure then one can use this overall parity to immediately reconstruct this column.

The other parities of the [219, 217, 3] RS code words need to be used as an extra check such that the situation of one decoding failure together with one miscorrection is detected. Let a be the index of the column corresponding to the decoding failure and let b be the index of the column corresponding to the miscorrection. Let E be the set of error locations in the b-th column. The vectors $v^i$, $i \in F$, contain one erasure and one error if none of the sets $\{j, 217+(j+i \bmod 217)\}$, $0 \le j \le 216$, is equal to $\{a, b\}$. All sets $\{j, 217+(j+i \bmod 217)\}$ are unequal to one another. Hence, for at most one index i in E the vector $v_i$ does not contain one erasure together with one error. As will be explained below column b contains at least two errors, that is $|E| \ge 2$. Thus, there is at least one row $v^i$ containing one erasure and one decoding failure. This will be detected by using the [219, 217, 3] RS code structure.

If there is one miscorrection of LDC code word and no decoding failure (S25) then the reconstructed vectors $v^i$ contain at most one error which can be corrected by using the parities in the BIS columns. By comparing the positions of the errors in the vectors $v^i$ (there are at least two errors), one can find out which LDC code word was miscorrected as follows. Suppose that column b of the second intermediate code block I2 composed by the rows $r^i$ corresponds to the miscorrected LDC code word. This column is a code word in [217, 216, 2] and therefore contains at least two errors. Let E be the set of error locations in the b-th column:

case $b \le 216$: this means all vectors $V_b^i$ for $i \in E$ are incorrect and will be corrected by using the [219, 217, 3] code structure. No other code vectors $v_j^i$ will be corrected. The corrected code vectors all share the joint lower index j=b. This reveals b, and one is able to reconstruct $r_b^i = v_b^i + r_{217+(b+i \bmod 217)}^i$ for $i \in E$.

case b>216: now all code vectors $V_{b-i \bmod 217}^i = r_{b-i \bmod 217}^i + r_{217+b}^i$ for $i \in E$ are incorrect. For these $v_{b-i \bmod 217}^i$ the upper index plus the lower index equals b mod 217. In other words, they are on a diagonal. So, after their correction b is revealed by checking which diagonal contains the errors. As before, one is therefore able to reconstruct all code symbols $r_j^i$.

To distinguish both cases one needs to be able to distinguish whether the errors are on a line or on a diagonal. This is possible because there are at least two errors.

For completeness, the detection of three decoding failures (S26) is immediately possible. Further, two miscorrections (S28) can be detected because the errors in $v_j^i$ can not be on one line or on one diagonal.

The decoding strategy can be simplified by assuming no miscorrection of LDC code words occurs. Also, since the one decoding failure correction is much simpler than the two decoding failure correction, it could be chosen to only implement the one decoding failure correction at the cost of not exploiting the full error correcting capability of the third layer according to the present invention. In order to correct 2 times 216 erased LDC bytes, at least 432 redundant parity check bytes are needed. The method according to the present invention uses 434 redundant bytes and is thus almost optimal.

According to the present invention it is thus intended to introduce a product code structure as it is used for DVD. The extra horizontal parities obtained during encoding are stored in the BIS columns. They can be obtained during decoding without errors after the BIS decoding since the BIS columns are very well protected. The question is, however, what kind of product structure is allowed and what kind of protection is needed.

In the errors only regime there is one LDC code word with too many errors after the burst recognition. One times the number of erasures plus two times the number of errors exceeds its redundancy of 32 bytes. It is intended to add extra product structure such that one can correct two such LDC code words (more is not possible because one only has 576 bytes available in the BIS columns and less turns out to be worse than the DVD product code). If an LDC code word has too many errors after burst recognition then the probability of a miscorrection is extremely small, instead one will detect that one can not correct the LDC code word. One only needs to correct the 216 data bytes in such a detected LDC code word. There are 304 LDC code words. These shall be taken as columns in a matrix. If one adds 2 more columns such that every row has a distance 3 then the problem is solved because the two undecodable LDC code words can be detected, and one can erase them and use the two parity columns to correct them.

However, it is not this easy. One wants the row code words to have length 306, dimension (=number data bytes=number of LDC data columns) 304, distance 3. And also one wants to use bytes that is 8-bit symbols. Such RS codes do not exist. The maximal length is $2^8-1$ for a non-extended RS code over bytes with minimum distance at least 3. The minimal number of extra bytes needed in the product code for correcting the two LDC code words is at least 216*2=432 bytes (there are 216 rows, and to correct one byte erasure one byte is needed).

Another explanation why the decoding according to the present invention works shall be given in the following using different cases. The cases are:
A) two LDC columns of 217 bytes are erased in the first matrix (U1);
B) the same but now in the second matrix (U2);
C) one LDC column of 217 bytes is erased in the first matrix and one is erased in the second matrix;
D) one LDC column of 217 bytes is in error in the first matrix (in the unlikely event that the LDC code word is miscorrected and one was unable to detect the presence of too many errors which would lead to an erased LDC column of 217 bytes);
E) one LDC column of 217 bytes is in error in the second matrix.

Ad A): The two erased columns in U1 lead to two erased columns in V. All the other bytes of V can be computed with the data bytes from the corrected LDC code words. If no LDC code word was miscorrected (which is this case A) then all the other bytes of V have the correct value. The 2 parity columns stored in the BIS area are without errors as well (as explained before). So, one can correct the two erasures in each row of V because the RS code words over the rows with the parities has distance 3. Since matrix U2' (which is derived from U2 by shifting the symbols of each row by a certain number of locations in horizontal direction before applying the adding operation) is known one can subtract it from the corrected V to obtain U1. Thus all the LDC data bytes are now corrected. If there was also a LDC code word miscorrected then one is in troubles: one can either detect that one can not correct all the rows of V or one performs a miscorrection.

Ad B): The two erased columns in U2 lead to two erased diagonals in U2' and hence in V. As in case A, one has two erasures per row in V. One can correct V, subtract the known U1 to obtain U2'. One shifts the rows in matrix U2' to obtain U2. Hence, all the LDC data bytes are now corrected.

Ad C): One erased column in U1 leads to one erased column in V. One erased column in U2 leads to one erased diagonal in U2' and hence in V. So, in V one has one erased column and one erased diagonal. Extra care is needed: the erased column and the erased diagonal overlap in exactly one position. This means that all rows of V have two erasures except for one row which has one erasure. As in cases A and B one can correct V. But how to find back U1 and U2'? If a position is erased in U1 and not in U2' then the value of this position in U2' can be subtracted from the value of this position in V to obtain the value of the erased position in U1. Similarly, one can reconstruct the erased positions in U2' which are not erased in U1. One has one problem: there is exactly one position in U1 and in U2' which is in both matrices erased. This position remains erased in matrices U1 and U2'. So one can reconstruct matrix U1 and matrix U2 (after shifting its rows) except for a single erasure in U1 and a single erasure in U2. Since one has 217 rows in matrix U1 coming from the first 217 bytes of an LDC code word, each column in U1 is a RS code word with minimum distance 2. This is sufficient to correct the single erasure. Similarly, one can correct the single erasure in U2.

Ad D) and E): If there is a miscorrection in a LDC code word then there are at least 33 (=minimum distance) bytes in error. If one keeps only 217 bytes and discards 31 bytes one knows for sure at least 2 errors remain. In the cases D and E one has one miscorrected LDC code word. This leads either to at least 2 errors in a column of U1 or to at least 2 errors in a column of U2. In both cases this leads to at least 2 errors all in separate rows of V. These can be corrected because together with the parities stored in the BIS area one has distance 3 per row with the parities. This means one can correct 1 error per row. Once V is corrected, the question remains which column in U1 or in U2 was miscorrected.

Ad D): The errors are in a column of U1 hence they appear in a column of V. There are at least 2 errors: so one can recognize whether they are oriented in a column. If so, one knows U2' which is subtracted from the corrected V to obtain U1. All errors are again corrected: U1 and U2 are both reconstructed.

Ad E): The errors are in a column of U2 hence they appear in a diagonal of U2' and therefore also in a diagonal of V. There are at least 2 errors: so one can recognize whether they are oriented in a diagonal (compared to a column). If so, one knows U1 which is subtracted from the corrected V to obtain U2. All errors are again corrected.

In a more general situation where any picket code can be used one has m [n, k, d] RS code words over GF (q), i.e. the LDC code words. For each of the m code words k code word positions are encoded into a [k+p, k, p+1] RS code word over GF (q). These will form the columns of a matrix $\{R_{ij}\}_{0 \leq i \leq k+p-1, 0 \leq j \leq n-1}$. For each $0 \leq i \leq k+p-1$ the set of numbers $\{0, \ldots, m-1\}$ is partitioned into non-empty sets $S_{i,w}$, $0 \leq w < s_i$. It is computed $V_{i,w} = \Sigma_{j \in Si,w} R_{i,w}$, for $0 \leq i \leq k+p-1$ and $0 \leq w \leq s_i - 1$. For each i $\{V_{i,w}\} 0 \leq w \leq s_i - 1$ is systematically encoded into a code word with distance D by computing $p_i$ parity symbols. The $\Sigma_{0 \leq i \leq k+p-1} p_i$ parity symbols are stored in the BIS columns.

Supposed that the sets $S_{i,w}$ satisfy the following contraint. For all $0 \leq j \leq m-1$ and for all sets F not containing j and having D-1 elements, $\#\{i: S_{i,w} \cap F \neq \emptyset$ for w such that $j \in S_{i,w}\} \leq p_i$.

Then up to D-1 decoding failures of LDC code words can be corrected. Combinations of decoding failures and miscorrections may be also corrected. The method as described above is used: $V_{i,w}$ is computed by means of the formula in the previous paragraph. If possible, the unknown $V_{i,w}$ are recovered by erasure correction using the $p_i$ parities, by using the formula for $V_{i,w}$ all entries of the matrix R are reconstructed except for at most p entries in the columns corresponding to decoding failures, and finally the redundant information in these columns is used to completely reconstruct matrix R and, if necessary, all LDC code words.

The present invention can also be applied to a product code. In DVD a product code is used to extend a matrix D in both horizontal as well as vertical direction. The parities on parities guarantee a large product distance. In practise, the rows which are oriented in the writing direction are decoded. If affected by too many random errors or a burst error a decoding failure appears. The vertical redundancy should recover from made miscorrections and decoding failures.

In the above described extension of the picket code the matrix R plays the role of matrix D. Also here a kind of product code is formed; however, no parities on parities are needed since it is assumed that the horizontal parities are not corrupted due to the high protection by the BIS code words. Now columns may be affected by decoding failures or miscorrections. The above described "adding trick" is introduced because the length of RS codes is bounded by the field size. It will now be explained how this "adding trick" can be used to provide an alternative to product codes in general with reference to FIGS. 7 and 8.

Figure 7:
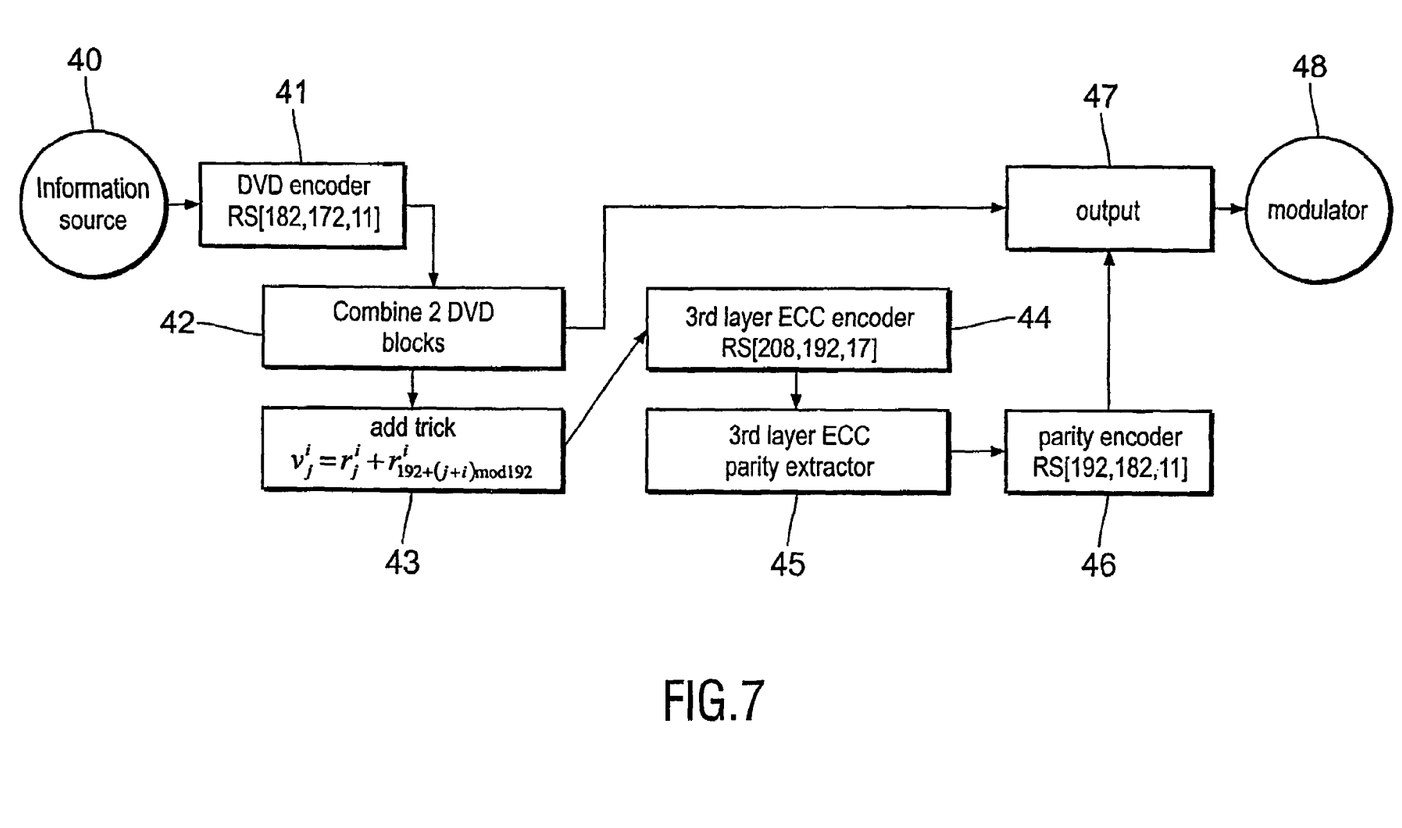
FIG. 7 shows a block diagram of another embodiment of an encoding apparatus according to the present invention.
Figure 8:
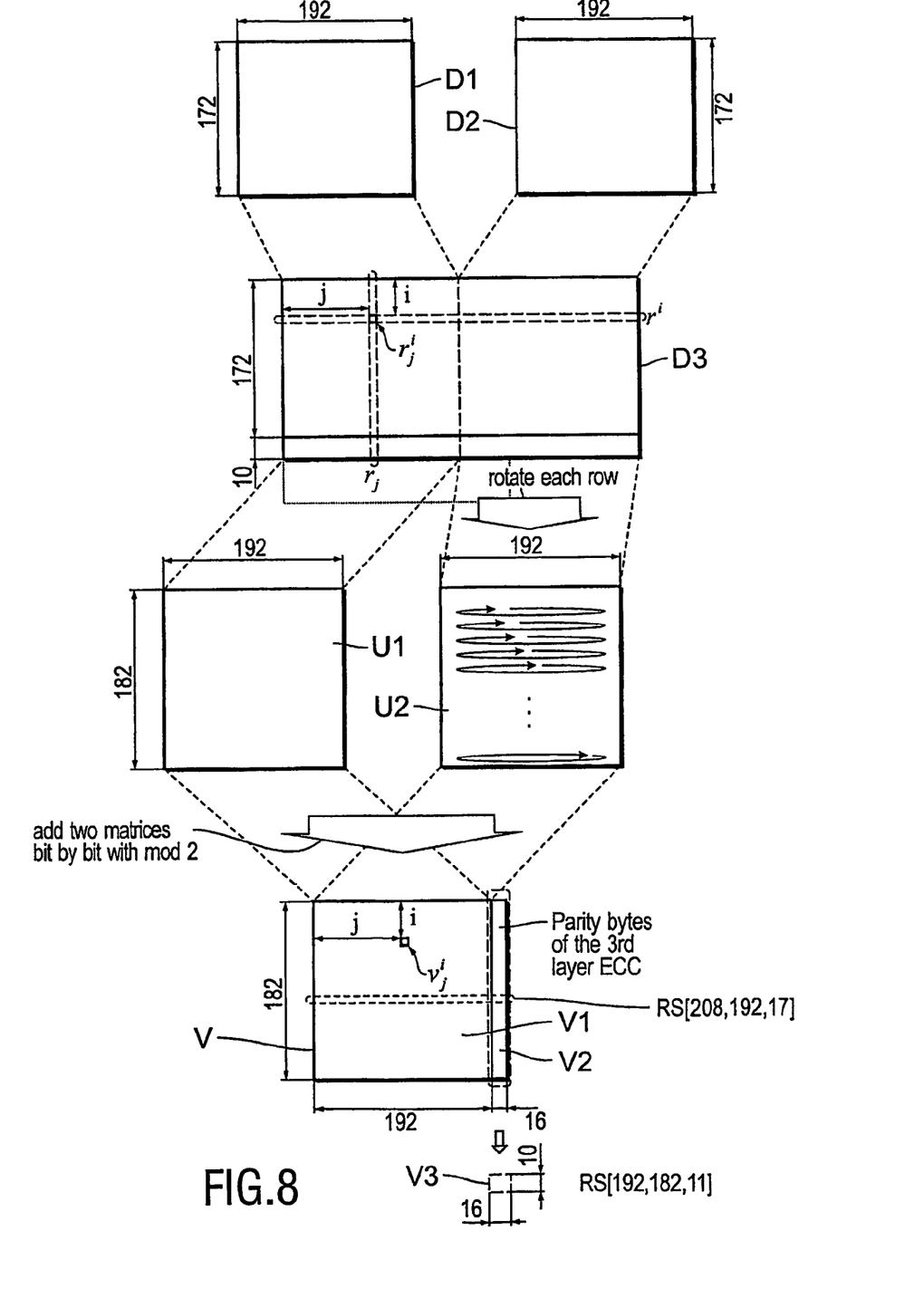
FIG. 8 illustrates the application of the invention to a product code.

A first straightforward extension is to encode the columns representing the extra horizontal parities of the third layer into code words thereby guaranteeing a large minimum distance if there is a significant probability that these columns can not be recovered without errors. As an example the "adding trick" is applied onto DVD blocks D1, D2 after interchanging the role of columns and rows, each DVD block D1, D2 being a 172 by 192 matrix as shown in FIG. 8. Before or after combining those two DVD blocks D1, D2 by unit 42, all its columns are encoded by a DVD encoder 41 into 2×192 [182, 172, 11] RS code words over GF ($2^8$) resulting in a combined DVD block D3 being a 182 by (2×192) matrix. The data to be encoded are thereby obtained from an information source 40. This combined DVD block D3 is now partitioned as described above. That is, it is computed $V^i_j = r^i_j + r^i_{192+(j+i \bmod 192)}$ for $0 \leq i \leq 181$ and $0 \leq j \leq 191$ in unit 43. The obtained matrix V1 is then encoded in horizontal direction by a third layer ECC encoder 44 resulting in 182 [208, 192, 17] RS code words over GF ($2^8$) giving a matrix V. The parities V2 form 16 columns of 182 bytes. These are extracted by a parity extracter 45 and thereafter encoded into 16 [192, 182, 11] RS code words over GF ($2^8$) by a parity encoder 46 giving a parities on parities block V3. The extended matrix D3 together with these 16 code words is then outputted by an output unit 47 to a modulator 48 for further processing, e.g. writing it on a disk. If 2 DVD blocks were interleaved according to the known method 9664 (=2×(192×10+182× 16)) parity symbols would be needed. By using the "adding trick" according to the invention only 6912 (=2×192×10+ 192×16) parity symbols are needed.

During decoding all columns are first decoded which may lead to decoding failures and miscorrections. As desribed above it is continued by reconstructing matrix V as much as possible leaving erasures. Now the horizontal code structure is used to correct erasures and errors in matrix V. Then matrix D3 must be reconstructed as much as possible while recognizing miscorrected columns. The vertical parities will show how to completely reconstruct matrix D3.

The performance of two interleaved DVD blocks and the performance of the proposed method need to be compared. In vertical direction both methods are equally strong. In horizontal direction more than 16 parities per row may be required according to the proposed method. But even with 14 extra parities (increasing 16 to 30 parities) one can save in the amount of redundancy. Thus, the proposed method is a very and useful tool for improving error correction capabilities.

The invention claimed is:

1. A method of embedding an additional layer of error correction into an error correcting code, wherein information is encoded into code words of said error correcting code and wherein a number of code words are arranged in the columns of a code block, said method comprising the acts of:
   reducing the length of each row of said code block by adding X row symbols together to form Y row symbols replacing the X row symbols, Y being less than X, to form shortened rows according to a predetermined adding rule resulting in a reduced code block;
   encoding the shortened rows of said reduced code block using a horizontal error correcting code to obtain horizontal parities, and embedding said horizontal parities as additional layer in said error correcting code.

2. The method as claimed in claim 1, wherein said code block is a Long Distance Code (LDC) block comprising LDC code words, in particular Reed Solomon code words over GF($2^8$), arranged in the columns of said LDC block.

3. The method as claimed in claim 2, further comprising the initial acts of:
   reducing the length of each LDC code word of said LDC block resulting in a first intermediate block, and
   extending each row of said first intermediate block by a predetermined number of symbols having predetermined values resulting in a second intermediate block which is used as code block in subsequent acts.

4. The method as claimed in claim 3, wherein the length of each LDC code word is reduced by puncturing a predetermined number of symbols at predetermined positions of each LDC code word.

5. The method as claimed in claim 3, wherein the length of each LDC code word is reduced by selecting a predetermined number of symbols of a LDC code word and by determining a predetermined number of parity symbols for said LDC code word.

6. The method as claimed in claim 3, wherein the rows of said first intermediate block are extended by adding a predetermined number of symbols having symbol value zero to each row.

7. The method as claimed in claim 1, wherein the length of each row of said code block is reduced by adding the (m+(j+i mod k))-th symbol of each row to the j-th symbol of the same row, i being the row number, j being the column number and m being the maximum number of columns divided by 2.

8. The method as claimed in claim 1, wherein said code block comprises two blocks of a product code, in particular of a DVD product code, comprising product code words, in particular product code words of the same DVD product code such as code words over $GF(2^6)$, arranged in the columns of said code block.

9. The method as claimed in claim 1, wherein said horizontal parities are encoded by an additional error correcting code, in particular by a Burst Indicator Subcode (BIS) comprising Reed Solomon code words over $GF(2^8)$ or by an additional parity code comprising Reed Solomon code words over $GF(2^8)$.

10. A method of decoding an error correcting code into which an additional layer of error correction is embedded according to a method of claim 1, wherein horizontal parities are embedded as additional layer in said error correcting code and wherein a number of code words of said code are arranged in the columns of a code block, said method comprising the acts of:

extracting said horizontal parities from said error correcting code, reducing the length of each row of said code block by adding row symbols together identical to the method according to said predetermined adding rule used during the method of encoding according to claim 1 resulting in a reduced code block, and decoding the shortened rows of said reduced code block using said horizontal parities.

11. A method as claimed in claim 10, further comprising the steps of decoding a received data stream to obtain said code block and of correcting errors and erasures in the obtained code block by subtracting row symbols of said obtained code block from row symbols of said reduced code block according to a predetermined subtraction rule reverse to said predetermined adding rule.

12. An apparatus for embedding an additional layer of error correction into an error correcting code, wherein information is encoded into code words of said error correcting code and wherein a number of code words are arranged in the columns of a code block, comprising:

means for reducing the length of each row of said code block by adding X row symbols together to form Y row symbols replacing the X row symbols, Y being less than X to form shortened rows according to a predetermined adding rule resulting in a reduced code block;

means for encoding the shortened rows of said reduced code block using a horizontal error correcting code to obtain horizontal parities, and means for embedding said horizontal parities as additional layer in said error correcting code.

13. The apparatus for decoding an error correcting code into which an additional layer of error correction is embedded according to a method of claim 1, wherein horizontal parities are embedded as additional layer in said error correcting code and wherein a number of code words of said code are arranged in the columns of a code block, comprising:

means for extracting said horizontal parities from said error correcting code, means for reducing the length of each row of said code block by adding row symbols together identical to the method according to said predetermined adding rule used during the method of encoding according to claim 1 resulting in a reduced code block, and means decoding the shortened rows of said reduced code block using said horizontal parities.

14. A storage medium storing data in form of code words of an error correcting code into which an additional layer of error correction is embedded according to a method of claim 1, wherein horizontal parities are embedded as additional layer in said error correcting code and wherein a number of code words of said code are arranged in the columns of a code block.

15. A method of embedding an additional layer of error correction into an error correcting code of a code block, the method comprising the acts of:

modifying each row of said code block to form modified rows resulting in a modified code block;

encoding the modified rows to obtain parities; and embedding the parities as an additional layer in the error correcting code;

wherein a length of each modified row is reduced by adding (m+(j+i mod k))-th symbol of each modified row to the j-th symbol of the same modified row, i being a row number, j being a column number, and m being a maximum number of columns divided by 2.

16. An apparatus for embedding an additional layer of error correction into an error correcting code of a code block, the apparatus comprising:

means for modifying each row of said code block to form modified rows resulting in a modified code block;

means for encoding the modified rows to obtain parities; and means for embedding the parities as an additional layer in the error correcting code;

wherein a length of each modified row is reduced by adding (m+(j+i mod k))-th symbol of each modified row to the j-th symbol of the same modified row, i being a row number, j being a column number, and m being a maximum number of columns divided by 2.

* * * * *